United States Patent [19]

Hsieh et al.

[11] Patent Number: 4,855,619
[45] Date of Patent: Aug. 8, 1989

[54] BUFFERED ROUTING ELEMENT FOR A USER PROGRAMMABLE LOGIC DEVICE

[75] Inventors: Hung-Cheng Hsieh, Sunnyvale; William S. Carter, Santa Clara, both of Calif.

[73] Assignee: Xilinx, Inc., San Jose, Calif.

[21] Appl. No.: 121,963

[22] Filed: Nov. 17, 1987

[51] Int. Cl.$^4$ .................................... H03K 19/017
[52] U.S. Cl. .................................... 307/443; 307/465; 307/468; 307/243
[58] Field of Search .................... 307/200 B, 443, 465, 307/468, 469, 243, 246, 584, 585, 272 A; 364/716

[56] References Cited

U.S. PATENT DOCUMENTS

| | | | |
|---|---|---|---|
| 4,371,797 | 2/1983 | Frank | 307/243 X |
| 4,544,854 | 10/1985 | Ulmer et al. | 307/243 X |
| 4,642,487 | 2/1987 | Carter | 307/465 |
| 4,709,173 | 11/1987 | Nishimichi et al. | 307/243 |
| 4,758,745 | 7/1988 | Elgamal et al. | 307/468 X |

OTHER PUBLICATIONS

Mead and Conway, Introduction to VLSI Systems, Addison-Wesley Pub. Co., Reading, Mass., Oct, 1980, pp. 220-233.

Primary Examiner—David Hudspeth
Attorney, Agent, or Firm—Skjerven, Morrill, MacPherson, Franklin & Friel

[57] ABSTRACT

A programmable interconnect for programmably connecting transmission lines which are part of a configurable logic array is combined with a buffer at locations within the logic array where a signal will travel from a low capacitance line to a higher capacitance line. Use of a buffer in this arrangement allows for programmable interconnects controlling the configuration of the logic array to be smaller; consuming less power and providing for faster rise and fall of an output signal even when propagating through a long series of programmable interconnects. Several arrangements for programmably controlling the interconnect are taught. Also taught is a means for achieving a very wide AND gate without the need for cascading smaller devices.

29 Claims, 3 Drawing Sheets

BUFFERED ROUTING ELEMENT FOR A USER PROGRAMMABLE LOGIC DEVICE

BACKGROUND OF THE INVENTION

This invention relates to VLSI semiconductor circuits and to controlling signal quality on high speed transmission lines. More particularly it relates to interconnect circuitry for programmable and configurable logic arrays.

FIG. 1 depicts part of a prior art routing resource of a programmable logic device having programmable switches S1-S8 for programmably connecting transmission lines Y1-Y10 to lines LL1, LL2, XIN and XOUT. Switches S1-S8 typically comprise transistors in which the control terminal is controlled by a means not shown to either connect or not connect the lines which intersect at the switch location.

Examples of prior art switching devices are shown in FIG. 2. Switch S1 of FIG. 1 could represent FIG. 2a, in which lead A of FIG. 2a is connected to line XIN of FIG. 1 and lead B is connected to line Y1 of FIG. 1. If a "1" is present in memory cell M1a of FIG. 2a, a high voltage turns on N-channel pass transistor 2a of FIG. 2a, which is represented by switch S1 of FIG. 1, thereby connecting lines XIN and Y1. In the circuit of FIG. 2a, a high signal at lead A produces a signal at lead B lower by one threshold voltage drop than the voltage provided by the control lead from memory cell M1a. In another prior art embodiment, as shown in FIG. 2b, switch S1 of FIG. 1 may comprise a parallel pair of N and P-channel pass transistors 2b1 and 2b2 respectively, controlled by memory cell M1b with complementary output signals Q and $\bar{Q}$. As discussed in this application, all memory cells will be assumed to provide two complementary output signals Q and $\bar{Q}$. The embodiment of FIG. 2b is preferred for avoiding a threshold voltage drop between points A and B at any voltage when transistors 2b1 and 2b2 are turned on by memory cell M1b. FIG. 2c shows a third embodiment having a P-channel pass transistor 2c controlled by the inverted signal from memory cell M1c. If a "1" is present in memory cell M1c of FIG. 2c, a low voltage turns on P-channel transistor 2c of FIG. 2c. This embodiment has the drawback that a low signal at lead A produces a signal at lead B higher by one threshold voltage than the voltage provided by the control lead from memory cell M1c.

Likewise, switch S4 of FIG. 1 could represent FIG. 2a, 2b, or 2c, in which lead A of FIG. 2a, 2b, or 2c is connected to line Y3 of FIG. 1 and lead B of FIG. 2a, 2b, or 2c is connected to line LL2. Other switches S1 through S8 can represent pass transistors shown in FIGS. 2a, 2b or 2c, as desired. If a user of the device shown in FIG. 1 wishes to provide a signal present on input lead IN to output lead OUT, the interconnect device is programmed so that switches S2, S4, S6, and S8 are closed, thereby connecting lines XIN to Y3, Y3 to LL2, LL2 to Y8 and Y8 to XOUT respectively.

An actual device may incorporate enough such programmable interconnect switches in series between an input and an output lead that there is significant attenuation of the signal before it reaches its destination. The attenuation is caused by series resistance and capacitance introduced by the transistor channels and connecting lines. This degradation appears in the form f both slower response (rise time) due to the line and channel capacitances, and altered voltage on the signal line. FIG. 2 shows FET devices, however the equivalent problem would exist with bipolar transistors.

The problem of capacitance is particularly noticeable and serious when a transmission line such as line LL2 serves as a long bus for connecting many circuit elements. In the example of FIG. 1, a high quality signal provided by buffer BIN may not be degraded significantly by passing through switch S2 or by traveling on line Y3 if line Y3 is short and serves few circuit elements, and thus has low capacitance. In the case where line LL2 is long and serves as a bus for connecting many circuit elements, the signal which propagates onto line LL2 may experience RC delay due to the resistance of multiple transistor channels plus the large capacitance of line LL2, so that as it continues to propagate through switch S6, line Y8, switch S8, and line XOUT to buffer BOUT, the propagation delay and slower switching time are unacceptable.

SUMMARY OF THE INVENTION

The present invention provides a structure which compensates for the RC delay occurring on long paths. In a preferred embodiment the invention provides a structure which both compensates in situations where the compensation is necessary and does not compensate when not necessary. This compensation isolates the large capacitance of the long lines from the resistance of the pass transistors by locating a buffer in the signal path. In one preferred embodiment of the interconnect, parallel switches between crossing lines are provided, one switch having a buffer and one switch not having a buffer. The switches can be controlled to have an OFF state in which neither transistor is turned on, a first ON state in which the transistor in series with the buffer is turned on, and a second ON state in which the transistor in series with no buffer is turned on. This embodiment is preferred at an intersection of a low capacitance line and a high capacitance line, and is controlled such that if a signal is passing from the low capacitance line to the high capacitance line it is switched through the buffer, while if a signal is passing from the high capacitance line to the low capacitance line it is connected through the pass transistor not having a buffer. That way the signal is provided to be of high quality but the delay of the buffer occurs only when it is needed.

In another embodiment when one high capacitance line is to be connected to another high capacitance line, a bidirectional buffer is provided, so that the signal can propagate in either direction through the buffer. Appropriate bidirectional buffers are described in U.S. Pat. No. 4,713,557 which is hereby incorporated by reference.

In the situation where signal degradation would not be a problem in either direction, crossing transmission lines would preferably be programmably connected by one of the prior art devices shown in FIG. 2 and discussed above.

The buffer assures that the signal quality on the high capacitance line is of good quality. In a programmable array, it is not possible to know how the user will choose to connect lines. The signal may be passed through multiple connections before reaching a particular interconnect. The transistor channel resistance and other resistances will therefore degrade the signal. This is not a problem as the signal travels in low capacitance lines. However if the signal, after passing through several transistors, were placed directly onto a high capacitance line, the rise and fall time at the signal destination would be degraded in proportion to the product of resistance and capacitance experienced by the signal. This is called the RC delay. In order to assure that the RC delay is not excessive, according to the teaching of this invention, buffers are placed at interconnects to high capacitance lines. Then, wherever the signal entering a high capacitance line comes from, the quality is improved before it is placed on the high capacitance line.

If a signal is transferred from one high capacitance line to another high capacitance line, it is preferably always buffered. This is so that the buffer for driving the high capacitance line can be designed for the capacitance of that particular line and does not need additional driving power for use when a possible further high capacitance line is programmed to be connected.

On the other hand, it is not necessary to again buffer the signal as it proceeds to a low capacitance line, and it is preferable not to use a buffer when it is not needed. A buffer exacts the penalty of additional propagation delay, extra space on the chip, and additional power.

When the buffer is used to isolate high resistance portions of the transmission path from high capacitance portions of the transmission path, the high resistance portion of the path encounters the capacitance of only the gate of the buffer transistor, and the high capacitance portion of the path encounters the resistance of only the channels of the buffer transistors. Thus the RC product is assured to be small at all portions of the transmission path.

DETAILED DESCRIPTION

Figure 3:
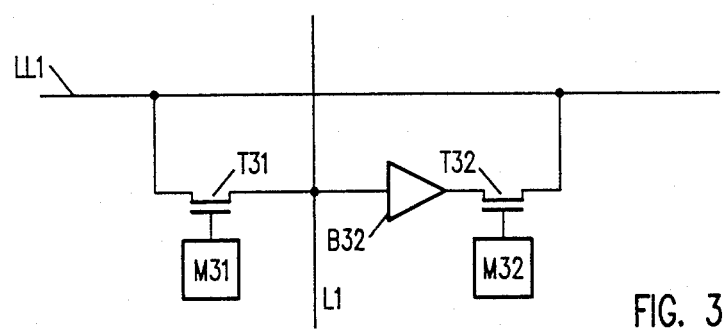
FIG. 3 shows a buffered programmable interconnect element of the present invention having a buffered interconnect in parallel with a non-buffered interconnect, one of which can programmably connect a signal line to a high capacitance transmission line.

FIG. 3 shows one embodiment of this invention in which a buffered interconnect is located in parallel with a nonbuffered interconnect between two signal lines to be programmably connected.

The embodiment of FIG. 3 is ideally used with bidirectional lines in which one line is high capacitance, for example a bus, and the other is low capacitance, for example a short piece of interconnect with few circuit elements such as transistors or gates attached to it. Programming of memory cells M31 and M32 which control the states of transistors T31 and T32 respectively depends on the direction of signal flow. If the signal is to propagate from high capacitance line LL1 to low capacitance line L1, no buffer is needed, and in this case when connection between line LL1 and line L1 is desired, pass transistor T31 is turned on by placing a logic "1" in memory cell M31 and a logic "0" into memory cell M32. If the signal is to propagate from low capacitance line L1 to high capacitance line LL1, signal buffer B32 is used, by placing a logic "1" into memory cell M32 and a logic "0" into memory cell M31. Signal buffer B32 amplifies and improves the waveform of the signal on line L1 before it is placed on high capacitance line LL1. Line LL1 will have high capacitance if it is long or if it has many transistors or gates attached to it. Thus the circuit of FIG. 3 allows the choice between a buffered signal and a non-buffered signal, thereby assuring a high quality signal on line LL1.

As shown in FIG. 3, transistor T32 is connected to the output lead of buffer B32. Buffer B32 and transistor T32 cannot be placed in series with transistor T32 connected to the input lead of buffer B32. Transistor T32 is needed to prevent connecting the output lead of buffer B32 to line LL1 when line L1 is not to be connected to line LL1. Additionally, not placing transistor T32 at the input terminal of buffer B32 avoids having a floating buffer input terminal.

Figure 4:
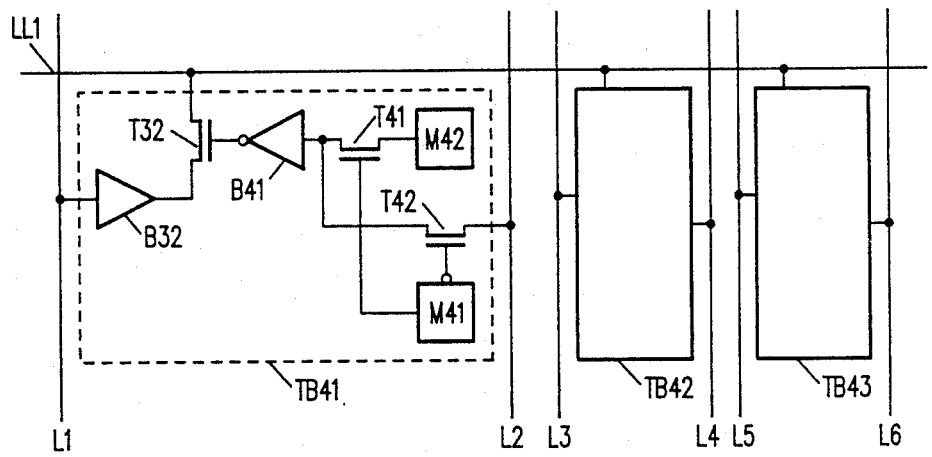
FIG. 4 shows a buffered programmable interconnect element of the present invention in which a signal line is connected to a high capacitance line under control of an enable buffer control line.

FIG. 4 differs from FIG. 3 in that memory cell M32 of FIG. 3 is replaced by a control buffer comprising enable buffer B41, transistors T41 and T42 and memory cells M41 and M42. Memory cell M41 has its inverting output lead connected to the gate of transistor T42 and its non-inverting output lead connected to the gate of transistor T41. Transistor T41 connects the non-inverting terminal of memory cell M42 to enable buffer B41, and transistor T42 connects signal line L2 to enable buffer B41. Thus memory cell M41 controls whether the state of transistor T32 is controlled by memory cell M42 or by line L2. When memory cell M41 holds a "1", N-channel transistor T42 is OFF and N-channel transistor T41 is ON. Since transistor T42 is OFF and transistor T41 is ON, memory cell M42 is connected to enable buffer B41 and line L2 is not connected to enable buffer B41. Thus the state of transistor T32 is controlled by memory cell M42. When memory cell M41 holds a "0", transistor T42 is ON and transistor T41 is OFF, so that memory cell M42 is not connected to enable buffer B41 and line L2 is connected to enable buffer B41. Thus when memory cell M41 holds a "0", transistor T32 is controlled by line L2.

| Memory cell M41 | Memory cell M42 | Buffer TB41 |
| --- | --- | --- |
| 1 | 1 | OFF |
| 1 | 0 | ON |
| 0 | don't care | controlled by L2 |

Figure 5:
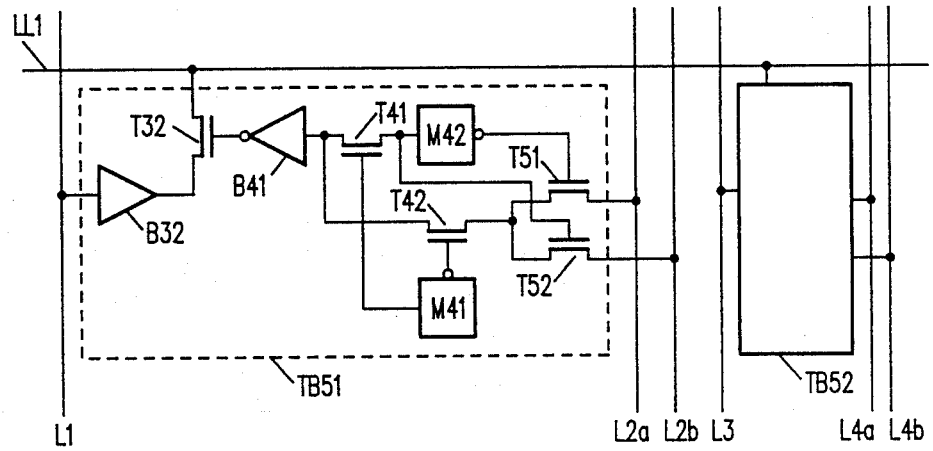
FIG. 5 shows a buffered programmable interconnect element of the present invention in which a choice of two control lines may control the connection of a signal line to a high capacitance line.

Note that in the embodiment of FIG. 4, when memory cell M41 holds a "0", the content of memory cell M42 is not used. Thus memory cell M42 is functional only when memory cell M41 holds a "1". A further embodiment shown in FIG. 5, in which elements having the same function as corresponding elements in FIG. 4 are given the same reference numerals, makes use of memory cell M42 during both states of memory cell M41. In the embodiment of FIG. 5, memory cell M42, in addition to being connected to transistor T41, has an inverting terminal connected to the gate of pass transistor T51 and a non-inverting terminal connected to the gate of pass transistor T52. Transistors T51 and T52 connect signal lines L2a and L2b through transistor T42 to buffer B41. Signal lines L2a and L2b of FIG. 5 replace the single signal line L2 of FIG. 4. When memory cell M41 holds a "1", memory cell M42 controls transistor T32. When memory cell M41 holds a "0", memory cell M42 selects which of data lines L2a or L2b controls transistor T32 by controlling which of transistors T51 or T52 is ON and thus which of lines L2a or L2b becomes the controller of enable buffer B41.

Buffer TB51 of FIG. 5 obeys the following truth table:

| Memory cell M41 | Memory cell M42 | Buffer TB51 |
| --- | --- | --- |
| 1 | 1 | OFF |
| 1 | 0 | ON |
| 0 | 1 | controlled by L2b |
| 0 | 0 | controlled by L2a |

When memory cells M41 and M42 are both logic "0", a high signal (logic "1") on line L2a will cause a high impedance to be presented by transistor T32 to long line LL1 and a low signal (logic "0") on line L2a will cause the signal provided by line L1 to be provided through signal buffer B32 to line LL1.

Similarly, buffer TB52 can be programmed so that lines L4a or L4b control whether the signal from line L3 is placed on long line LL1, or alternatively memory cells within buffer TB52 control whether the signal from line L3 is placed on long line LL1. Of course, the timing of the enable signals needs to be controlled so that at any time there is only one buffer driving the signal bus, long line LL1, such that there is no contention among the buffers.

Other embodiments having additional lines are equally possible and will be obvious to those skilled in the art in view of this disclosure. For example, memory cell M42 can be replaced by a pair of lines such as lines L2a and L2b and pair of transistors such as T51 and T52. Other means would then be used for controlling the states of these four transistors.

Figure 6:
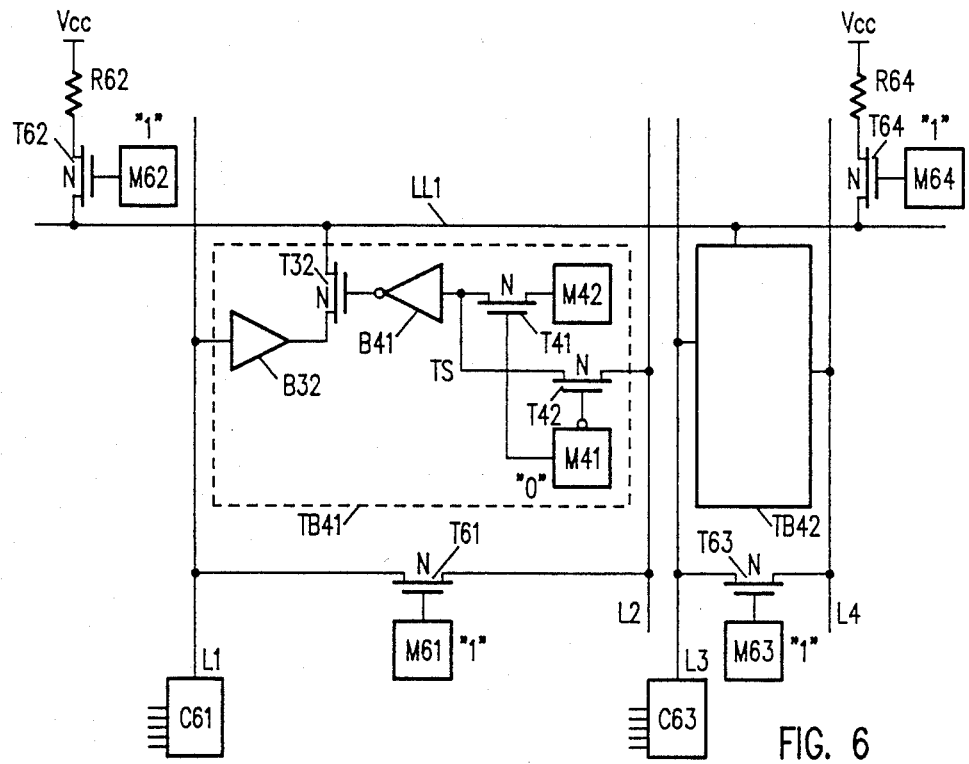
FIG. 6 shows a programmable interconnect element of the present invention useful for a wide gate AND function. This figure shows an application in which other combinational logic elements control the data signals which are provided as inputs to the wide AND gate.

FIG. 6 shows an embodiment of this invention particularly useful for implementing a wide gate having many inputs (large fan-in). Prior art devices have used cascade type logic for providing a function such as a wide AND of many input variables. Cascade devices suffer propagation delay caused by the signal passing through a series of gates.

The device of FIG. 6 provides an AND function of many variables in a single stage, thus avoiding the propagation delay of prior art cascading devices. As shown in FIG. 6, long line LL1 is pulled to a logic "1" voltage through resistors such as R62 and R64 tied to positive voltage supply Vcc as controlled by configurable memory cells M62 and M64 controlling N-channel transistors T62 and T64. Since the voltage on line LL1 is pulled high by resistors R62 and R64 only if all of buffers such as TB41 and TB42 are at high impedance, the logic of the series of buffers shown in FIG. 6 is AND. If any of buffers such as TB41 and TB42 provides a logic "0" on line LL1, the output signal will be logic "0". It is quite practical to connect 16, 32, or more such buffers in parallel to line LL1, thus providing an AND function of 16, 32, or more variables in a single stage.

Combinatorial logic elements C61 and C63, and others not shown can provide further fan-in to the wide function gate providing an output signal on long line LL1. Combinatorial logic elements are described in detail in patent application Ser. No. 06/588,478, incorporated herein by reference. In one embodiment of combinatorial logic elements such as represented by logic element C61 or C63, any function of five variables can be implemented, therefore the wide function gate output signal on long line LL1 is not limited to the AND function provided in the single stage of buffers TB41 and TB42.

If there are sixteen buffers such as TB41 attached to long line LL1, and each of the lines such as L1 and L3 have attached to them a combinatorial logic block such as blocks C61 and C63 each having five input signals, the device of this invention achieves a fan-in of 80:1 with only two stages.

Looking at the operation of buffer TB41 of FIG. 6, signal line L1 and buffer control line L2 are tied together through transistor T61 by setting memory cell M61 to logic "1". When a logic "1" is placed on line L1, a logic "1" also appears on line L2. In this example memory cell M41 is set to logic "0" so transistor T42 conducts and transistor T41 does not conduct. The signal provided by buffer TB41 on line LL1 is therefore controlled by line L1. Thus the logic "1" signal on line L1 causes inverting enable buffer B41 to turn OFF transistor T32, presenting a high impedance to line LL1. When a logic "0" is provided by line L1, inverting enable buffer B41 turns on transistor T32. Buffer B32 then provides the pull-down signal to line LL1 in response to the logic "0" on line L1. Buffer B32 is designed to accommodate the capacitance level of long line LL1 and the current through resistors such as R62 and R64 that occurs during a pull-down signal.

If additional buffers such as TB42 are also programmed as buffer TB41 so that the state of the buffer is controlled by the line corresponding to L1, line L3 will form the second input of the wide AND function, and so on. If all inputs to lines L1, L3, and other lines not shown are logic "1", all buffers will be disabled, and the output on line LL1 will be charged to a logic "1" level through the pull-up resistors. However, if any of the inputs on lines L1, L3 and others is a logic "0", the buffer with input at logic "0" will drive the output on line LL1 to logic "0". Combinatorial logic blocks C61 and C63 control the signals on lines L1 and L3 respectively. Different logic functions can of course be programmed to be provided by logic blocks C61, C63 and others not shown so that the output function on line LL1 is a complex function of many variables and is not restricted to AND.

Figure 7:
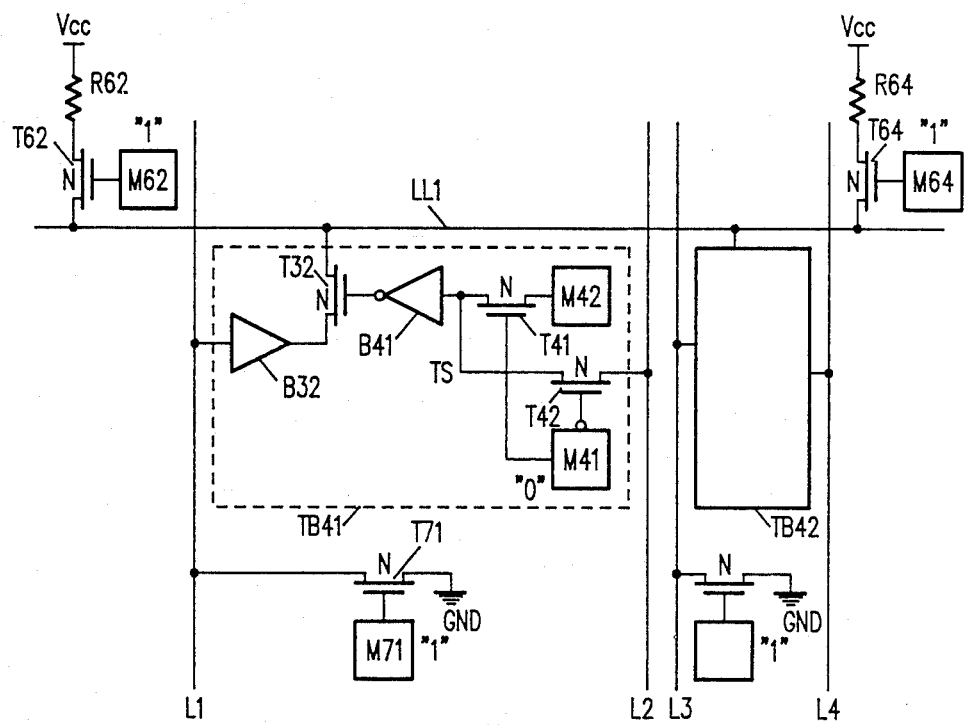
FIG. 7 shows another embodiment of a programmable interconnect element of the present invention also useful for a wide gate AND function.

FIG. 7 shows yet another embodiment of this invention. FIG. 7 is similar to FIG. 6, in that it is usable for implementing a wide function gate. In one use of the FIG. 7 circuit, memory cell M41 is programmed to hold logic "0" and line L1, which controls buffer B32, is tied through transistor T71 to ground by setting memory cell M71 to logic "1". In this embodiment, line L2 provides the input signal to be placed on data bus long line LL1. As in FIG. 6, long line LL1 is pulled high through resistors R62 and R64 when all buffer circuits such as TB41 and TB42 attached to long line LL1 are at high impedance. High impedance is provided when a logic "1" is provided on line L2, and enable buffer B41 turns OFF transistor T32. However, when a logic "0" is provided on line L2, enable buffer B41 turns ON transistor T32. Then buffer B32, which has a grounded input, pulls down long line LL1. The same combinatorial logic elements shown in FIG. 6 as connected to lines L1 and L3 can of course be connected to lines L2 and L4 of FIG. 7.

The embodiment of FIG. 7 is preferred over that of FIG. 6 when it is desirable to avoid a transient on long line LL1. A transient can occur in the embodiment of FIG. 6 when a high signal first appears on line L1 if the signal from line L1 propagates faster through buffer B32 than through transistor T61, transistor T42, and buffer B41. During this transient period, rather than a high impedance on line LL1, buffer TB41 momentarily presents a logic "1" signal. Such a transient could prevent another buffer from pulling down the output signal, producing transient high current, slow response, or erroneous results. In the embodiment of FIG. 7, the signal on line L1 does not toggle but is grounded. A high signal on line L2 propagates first to enable buffer B41, producing a high impedance. Thus no transient appears on line LL1.

The embodiment of FIG. 6 is preferred over that of FIG. 7 when the buffer location within the VLSI chip is such that a ground signal is difficult to generate.

Other embodiments similar to FIG. 6 may avoid the transient problem by not using transistor T61 and instead propagating a signal to line L2 before propagating the signal to line L1. This arrangement shuts off buffer B41 before providing a high signal on line L1 through buffer B32 and thus prevents the transient from occurring on line LL1.

Figure 1:
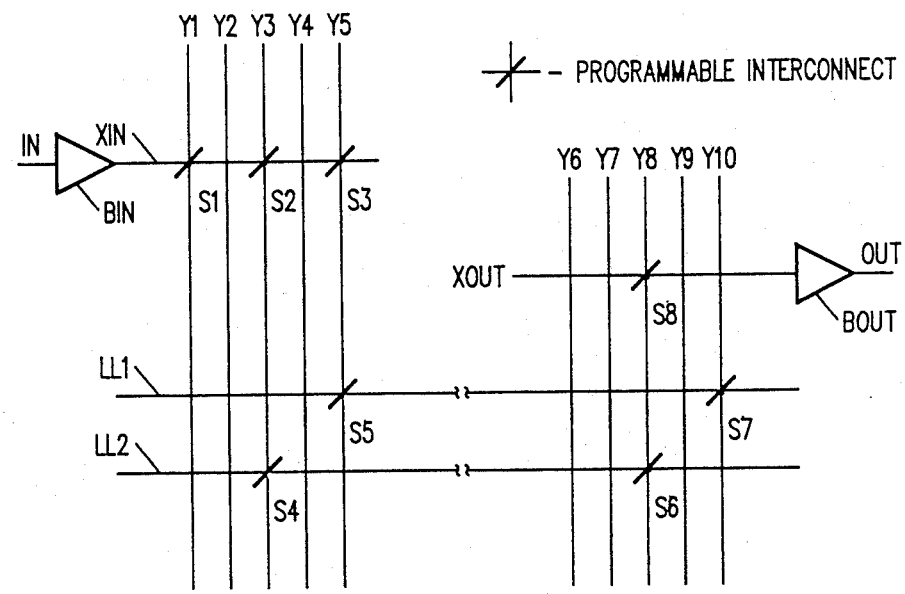
FIG. 1 shows portions of a configurable logic array in which programmable interconnect elements of this invention can be used.
Figure 2:
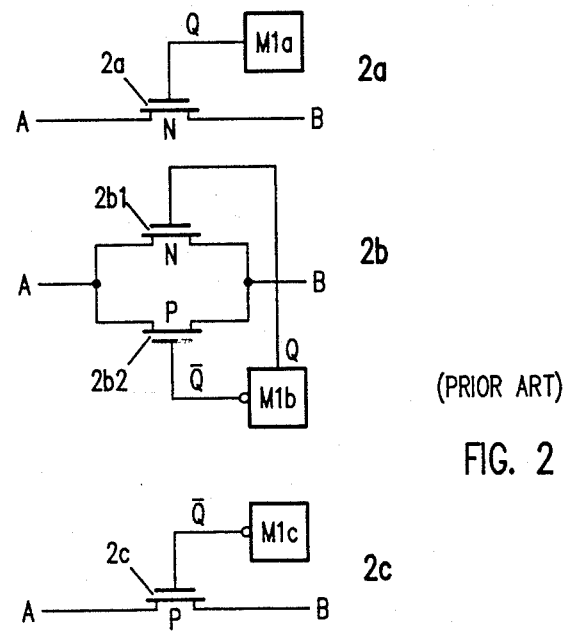
FIG. 2 shows three prior art programmable interconnect elements for programmably connecting lines such as those shown in FIG. 1.

Many other embodiments of the present invention incorporating the features taught here will become obvious to those skilled in the art and are intended to fall within the scope of this invention. For example although a single pass transistor is shown in FIGS. 3–7 for controlling the connection of one transmission line to another, it is obvious from FIG. 2 that the single pass transistor can be replaced by the parallel pair shown in FIG. 2b. For another example, buffer B41 can be eliminated and its input lead connected directly to the gate of transistor T32 if the gate capacitance of transistor T32 allows it to be driven by memory cell M42. Since buffer B41 is an inverter, other changes in logic are of course needed. For a further example, while the circuitry of FIGS. 4–7 is shown as providing alternate means of controlling pass transistor T32 which is in series with buffer B32, the same control circuits can also be used to control transistor T31 (FIG. 3) which is not in series with a buffer.

We claim:

1. A programmable interconnect for programmably connecting a first transmission line to a second transmission line comprising:
   a first programmable pass transistor having a first current carrying terminal connected to said first transmission line and a second current carrying terminal connected to the output terminal of a signal buffer, the input terminal of said signal buffer being connected to said second transmission line; and
   means for controlling the state of said first programmable pass transistor.

2. A programmable interconnect as in claim 1 further comprising:
   a second programmable pass transistor having its current carrying terminals connected between said first transmission line and said second transmission line; and
   means for controlling the state of said second programmable pass transistor.

3. A programmable interconnect as in claim 1 further comprising:
   a second pass transistor having a first current carrying terminal connected to said second transmission line and a second current carrying terminal connected to the output terminal of a second signal buffer, the input terminal of said second signal buffer being connected to said first transmission line; and
   means for controlling the state of said second programmable pass transistor.

4. A programmable interconnect as in claim 1 in which said means for controlling the state of said first programmable pass transistor comprises a first memory cell having an output terminal connected to the control terminal of said first programmable pass transistor.

5. A programmable interconnect as in claim 1 in which said means for controlling comprises:
   a first means for providing a first control signal;
   a second means for providing a second control signal; and
   a first means for selecting between said first and second control signals and providing a selected control signal to the control terminal of said first programmable pass transistor.

6. A programmable interconnect as in claim 5 in which said first means for selecting between said first and second control signals comprises:
   a second transistor having a first current carrying terminal connected to said first means for providing a first control signal;
   a third transistor having a first current carrying terminal connected to said second means for providing a second control signal;
   a first memory cell having a first output terminal connected to the control terminal of said second transistor and a second output terminal connected to the control terminal of said third transistor, said first memory cell providing complementary signals on its first and second output terminals;
   whereby one and only one of said second and third transistors provides on its second current carrying terminal said selected control signal.

7. A programmable interconnect as in claim 6 in which said first means for providing a first control signal is a second memory cell.

8. A programmable interconnect as in claim 6 in which said second means for providing a second control signal is a third transmission line.

9. A programmable interconnect as in claim 6 in which said second means for providing a second control signal comprises:
   a third transmission line having a third signal;
   a fourth transmission line having a fourth signal;
   a second means for selecting between said third signal and said fourth signal and providing said second control signal as selected from said third and fourth signals.

10. A programmable interconnect as in claim 9 in which said first means for providing a first control signal is a second memory cell having said first control signal on a first output terminal and having the complement of said first control signal on a second output terminal; and said second means for selecting between said third signal and said fourth signal comprises:

a fourth transistor having a first current carrying terminal connected to said third transmission line for receiving said third signal;

a fifth transistor having a first current carrying terminal connected to said fourth transmission line for receiving said fourth signal; and said second memory cell having said first output terminal connected to the control terminal of said fourth transistor and having said second output terminal connected to the control terminal of said fifth transistor.

11. A programmable interconnect as in claim 1 in which said means for controlling the state of said first programmable pass transistor comprises an enable buffer having an output terminal connected to the control terminal of said first programmable pass transistor, and which is in turn controlled by a first memory cell or by a third transmission line as selected by a means for selecting.

12. A programmable interconnect as in claim 11 in which said means for selecting comprises a second memory cell which turns on only one of a second pass transistor and a third pass transistor of which said second pass transistor has current carrying terminals connecting said first memory cell to an input lead of said enable buffer and of which said third pass transistor has current carrying terminals connected between said third transmission line and said input lead of said enable buffer.

13. A programmable interconnect as in claim 1 in which said means for controlling the state of said first programmable pass transistor comprises an enable buffer;
a first memory cell;
a second transistor having one current carrying terminal connected to the input terminal of said enable buffer and another current carrying terminal connected to said first memory cell;
a second means for controlling; and a first means for selecting;
said enable buffer being controlled by contents of said first memory cell or by said second means for controlling as selected by said first means for selecting.

14. A programmable interconnect as in claim 13 in which said enable buffer is an inverter.

15. A programmable interconnect as in claim 13 in which said first means for selecting comprises:

a second means for controlling;
a third transistor having a first current carrying terminal connected to said input terminal of said enable buffer and a second current carrying terminal connected to said second means for controlling;
a second memory cell having a first terminal connected to the control terminal of said second transistor and a second terminal connected to the control terminal of said third transistor such that only one of said second and third transistors is controlled to be on.

16. A programmable interconnect as in claim 15 in which said second means for controlling comprises:

a fourth transistor;
a fifth transistor;
a third transmission line;
a fourth transmission line;
a second means for selecting;
said fourth transistor having a first current carrying terminal connected to said third transmission line;
said fifth transistor having a first current carrying terminal connected to said fourth transmission line;
said fourth and fifth transistors having second current carrying terminals connected to said second current carrying terminal of said third transistor;
said second means for selecting having a first terminal connected to the control terminal of said fourth transistor and a second terminal connected to the control terminal of said fifth transistor such that only one of said fourth and fifth transistors is controlled to be ON.

17. A programmable interconnect as in claim 16 in which said second means for selecting comprises a memory cell having its non-inverting output terminal connected to said fourth transistor and its inverting output terminal connected to said fifth transistor.

18. A programmable interconnect as in claim 16 in which said second means for selecting comprises said first memory cell having its non-inverting output terminal connected to said fourth transistor and its inverting output terminal connected to said fifth transistor.

19. A programmable interconnect as in claim 1 in which said first transmission line is of higher capacitance than said second transmission line.

20. An array of programmable interconnects in which a first transmission line is common to all programmable interconnects in said array, each programmable interconnect for programmably connecting said first transmission line to a second transmission line, and comprising:

a first programmable pass transistor having a first current carrying terminal connected to said first transmission line and a second current carrying terminal connected to the output terminal of a signal buffer, the input terminal of said signal buffer being connected to said second transmission line; and means for controlling the state of said first programmable pass transistor.

21. An array of programmable interconnects as in claim 20 in which said first transmission line is pulled to a supply voltage level by at least one programmable pull-up means.

22. An array as in claim 21 in which said programmable pull-up means comprises resistance means in series with a programmably controlled transistor connected between said first transmission line and a supply voltage source having said supply voltage level.

23. An array as in claim 22 in which said programmably controlled transistor has a first current carrying terminal connected to said first transmission line, a second current carrying terminal connected through said resistance means to said supply voltage source, and a control terminal connected to an output terminal of a programmable memory means.

24. An array as in claim 20 in which, for each said programmable interconnect, configurable logic means are connected to said second transmission lines.

25. An array as in claim 20 in which, for each said programmable interconnect, said means controlling comprises an enable buffer having an output terminal connected to the control terminal of said first programmable pass transistor, and which is in turn controlled by a first memory cell or by a third transmission line as selected by a means for selecting, and further comprising, for each said programmable interconnect, means for connecting said second transmission line to said third transmission line.

26. An array as in claim 25 in which said means for connecting said second transmission line to said third transmission line comprises a programmable transistor controlled by a programmable memory cell.

27. An array as in claim 25 in which said enable buffer is controlled by said third transmission line.

28. An array as in claim 20 further comprising for each said programmable interconnect, means for connecting said second transmission line to a second voltage supply.

29. An array as in claim 28 in which said means for connecting said second transmission line to a second voltage supply comprises a programmable transistor controlled by a programmable memory cell.

* * * * *

UNITED STATES PATENT AND TRADEMARK OFFICE
CERTIFICATE OF CORRECTION

PATENT NO.   : 4,855,619

DATED        : Aug. 8, 1989

INVENTOR(S)  : Hung-Cheng Hsieh and William S. Carter

It is certified that error appears in the above-identified patent and that said Letters Patent is hereby corrected as shown below:

Col. 4, line 57, insert --Buffer TB41 of Fig. 4 obeys the following truth table:--.

Col. 9, lines 46 and 47, "a first means for selecting;" should be a new paragraph.

Signed and Sealed this

Thirtieth Day of October, 1990

Attest:

HARRY F. MANBECK, JR.

*Attesting Officer*          *Commissioner of Patents and Trademarks*